United States Patent
Wicke

(10) Patent No.: US 9,293,629 B2
(45) Date of Patent: Mar. 22, 2016

(54) OPTOELECTRONIC COMPONENT AND METHOD FOR OPERATING AN OPTOELECTRONIC COMPONENT

(75) Inventor: Markus Wicke, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 311 days.

(21) Appl. No.: 14/007,098

(22) PCT Filed: Mar. 19, 2012

(86) PCT No.: PCT/EP2012/054816
§ 371 (c)(1),
(2), (4) Date: Oct. 18, 2013

(87) PCT Pub. No.: WO2012/130657
PCT Pub. Date: Oct. 4, 2012

(65) Prior Publication Data
US 2014/0048680 A1 Feb. 20, 2014

(30) Foreign Application Priority Data

Mar. 29, 2011 (DE) .......................... 10 2011 015 408

(51) Int. Cl.
*H01L 31/153* (2006.01)
*H01L 25/16* (2006.01)
*H01L 25/075* (2006.01)

(52) U.S. Cl.
CPC ............ *H01L 31/153* (2013.01); *H01L 25/167* (2013.01); *H01L 25/0753* (2013.01); *H01L 2224/49171* (2013.01); *H01L 2924/0002* (2013.01)

(58) Field of Classification Search
CPC ....... H01L 31/153; H01L 27/14; H01L 27/15; H05B 37/00
USPC ........ 250/205, 239, 551, 552; 257/13, 80–82, 257/84, 99
See application file for complete search history.

(56) References Cited

U.S. PATENT DOCUMENTS 5,491,349 A 2/1996 Komoto et al.
6,812,498 B1 11/2004 Moon
(Continued)

FOREIGN PATENT DOCUMENTS

CN 102097447 6/2011
DE 10 2008 049 777 A1 11/2009
(Continued)

OTHER PUBLICATIONS

English translation of Korean Office Action dated Oct. 24, 2014 from corresponding Korean Patent Application No. 10-2013-7019980.
(Continued)

*Primary Examiner* — Kevin Pyo
(74) *Attorney, Agent, or Firm* — DLA Piper LLP (US)

(57) ABSTRACT

An optoelectronic component includes a carrier on which at least one first light-emitting semiconductor chip and one first light-absorbing semiconductor chip connected antiparallel to the at least one first light-emitting semiconductor chip, at least one second light-emitting semiconductor chip and one second light-absorbing semiconductor chip connected antiparallel to the at least one second light-emitting semiconductor chip, wherein the semiconductor chips are arranged on the carrier such that light from each light-emitting semiconductor chip falls on at least one of the light-absorbing semiconductor chips not connected to the respective light-emitting semiconductor chip, and the light-absorbing semiconductor chips are formed as protection diodes.

15 Claims, 4 Drawing Sheets

(56) References Cited

U.S. PATENT DOCUMENTS

| | | | |
|---|---|---|---|
| 2008/0297644 A1 | 12/2008 | Farchtchian et al. | |
| 2009/0141477 A1* | 6/2009 | Bhosale | F21V 33/00 362/95 |
| 2009/0212316 A1 | 8/2009 | Braune et al. | |
| 2013/0162959 A1 | 6/2013 | Wang et al. | |

FOREIGN PATENT DOCUMENTS

| | | |
|---|---|---|
| JP | 62-69694 | 3/1987 |
| JP | 5-075161 | 3/1993 |
| JP | 11-054804 | 2/1999 |
| JP | 2004-186309 | 7/2004 |
| JP | 2008-235792 | 10/2008 |
| WO | 2009/140947 | 11/2009 |

OTHER PUBLICATIONS

English translation of Korean Official Action dated Apr. 30, 2014 from corresponding Korean Patent Application 10-2013-7019980.

English translation of the Chinese Search Report dated Jun. 25, 2015 from corresponding Chinese Patent Application No. 201280015665.9.

Shih-Chang Shei et al., "Improved Reliability and ESD Characteristics of Flip-Chip GaN-Based LEDs With Internal Inverse-Parallel Protection Diodes," IEEE Electron Device Letters, vol. 28 No. 5, May 2007, pp. 346-349.

English translation of Japanese Notification of Reasons for Refusal dispatched Oct. 6, 2014 from corresponding Japanese Patent Application No. 2014-501530.

* cited by examiner

OPTOELECTRONIC COMPONENT AND METHOD FOR OPERATING AN OPTOELECTRONIC COMPONENT

TECHNICAL FIELD

This disclosure relates to an optoelectronic component and a method of operating an optoelectronic component.

BACKGROUND

Electronic components such as light-emitting diodes are protected by protection diodes connected to the light-emitting diodes and protect them in the event of current or voltage pulses, for example, resulting from electrostatic discharges (ESD). Protection diodes such as these are therefore normally also referred to as ESD protection diodes.

There is nonetheless a need to provide an optoelectronic component having light-emitting semiconductor chips and a method of operating an optoelectronic component.

SUMMARY

I provide an optoelectronic component including a carrier on which at least one first light-emitting semiconductor chip and one first light-absorbing semiconductor chip connected antiparallel to the at least one first light-emitting semiconductor chip, at least one second light-emitting semiconductor chip and one second light-absorbing semiconductor chip connected antiparallel to the at least one second light-emitting semiconductor chip, wherein the semiconductor chips are arranged on the carrier such that light from each light-emitting semiconductor chip falls on at least one of the light-absorbing semiconductor chips not connected to the respective light-emitting semiconductor chip, and the light-absorbing semiconductor chips are formed as protection diodes.

I also provide a method of operating an optoelectronic component including a carrier on which at least one first light-emitting semiconductor chip and one first light-absorbing semiconductor chip connected antiparallel to the at least one first light-emitting semiconductor chip, at least one second light-emitting semiconductor chip and one second light-absorbing semiconductor chip, which is connected antiparallel to the at least one second light-emitting semiconductor chip, wherein the semiconductor chips are arranged on the carrier such that light from each light-emitting semiconductor chip falls on at least one of the light-absorbing semiconductor chips not connected to the respective light-emitting semiconductor chip, and the light-absorbing semiconductor chips are formed as protection diodes, the method including in a first measurement step, the first light-emitting semiconductor chip is operated with a measurement current and a first photocurrent of a light-absorbing semiconductor chip is measured, on which light from the first light-emitting semiconductor chip falls and which is not connected to the first light-emitting semiconductor chip, in a second measurement step, the second light-emitting semiconductor chip is operated with a measurement current and a second photocurrent of a light-absorbing semiconductor chip is measured, on which light from the second light-emitting semiconductor chip falls and which is not connected to the second light-emitting semiconductor chip, a first operating current is determined from a difference between the first photocurrent and a first nominal value, a second operating current is determined from a difference between the second photocurrent and a second nominal value, and the first light-emitting semiconductor chip is then operated with the first operating current, and the second light-emitting semiconductor chip is operated with the second operating current.

I further provide a method of operating an optoelectronic component having a carrier on which at least one first light-emitting semiconductor chip and one first light-absorbing semiconductor chip connected antiparallel to the at least one first light-emitting semiconductor chip, are arranged, in which the first light-absorbing semiconductor chip is formed as an environmental-light sensor and as a protection diode, which produces a photocurrent by environmental light which falls on the optoelectronic component, and in which the at least one first light-emitting semiconductor chip is operated when a minimum value for the photocurrent is undershot.

DETAILED DESCRIPTION

Figure 1:
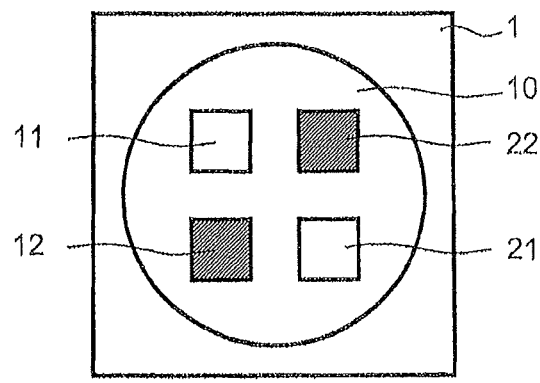
FIG. 1 shows a schematic illustration of an optoelectronic component according to an example.

Our optoelectronic component may have at least one light-emitting semiconductor chip. Furthermore, the optoelectronic component may also have a plurality of light-emitting semiconductor chips. The at least one semiconductor chip or the plurality of light-emitting semiconductor chips may, in particular, be formed as epitaxially grown semiconductor layer sequences, or each have an epitaxially grown semiconductor layer sequence. The semiconductor layer sequence may have an arsenide, phosphide and/or nitride compound semiconductor material whose composition and layer structure correspond to a desired emitted light. The light-emitting semiconductor chips are particularly suitable for emitting light in a wavelength range from ultraviolet radiation to infrared radiation.

At least one light-emitting semiconductor chip may have a wavelength conversion element which converts at least a portion of primary light, which is emitted by the light-emitting semiconductor chip, to secondary light which is different therefrom. The wavelength conversion element may be in the form of a dye layer, a dye platelet or a sheath containing dye following the semiconductor layer sequence of the light-emitting semiconductor chip.

The light-emitting semiconductor chips may emit different light from one another such that the optoelectronic component can emit mixed-color light in the form of a superposition of the light respectively emitted by the light-emitting semiconductor chips. For example, the light-emitting semiconductor chips may emit blue, red and green light, as a result of which the optoelectronic component can emit mixed light in the form of different colors and/or white light depending on the chosen light intensity of the individual light-emitting semiconductor components. Furthermore, it is also possible, for example, for a light-emitting semiconductor component to have a wavelength conversion element which converts blue primary light emitted by the light-emitting semiconductor chip to yellow and/or green and red secondary light such that the light-emitting semiconductor chip emits white light during operation. A further light-emitting semiconductor chip can emit red light, thus making it possible to achieve white mixed light with a high color reproduction index for the optoelectronic component. Depending on the desired color of the light emitted by the optoelectronic component, this may also have other combinations of light-emitting semiconductor components with different colors and/or the same color. The mixed-color light of the optoelectronic component can be adjusted by adjusting the respective light intensities relative to one another, and/or particularly preferably can also be readjusted in response to ageing-dependent color drifts.

The optoelectronic component may have at least one light-absorbing semiconductor chip. Furthermore, the optoelectronic component may also have a plurality of light-absorbing semiconductor chips. The at least one light-absorbing semiconductor chip or the plurality of light-absorbing semiconductor chips are, in particular, also form as protection diodes, that is to say, for example, ESD protection diodes. This means that the light-absorbing semiconductor chips have a forward-biased voltage sufficiently small to allow voltage or current pulses, also referred to in the following text as ESD pulses, which would possibly have a damaging effect on the light-emitting semiconductor chips, to be dissipated. A breakdown voltage suitably chosen in this way makes it possible to ensure that even minor ESD pulses which may, however, nevertheless have a damaging effect on the light-emitting semiconductor chips, can be effectively dissipated.

At least one light-absorbing semiconductor chip may be a silicon diode. In particular, this may have a forward-biased voltage of 0.6 up to 1.2 volts. Furthermore, a light-absorbing semiconductor chip in the form of a silicon diode may, in particular, be suitable for absorbing light in the visible to infrared spectral range, and converting it to an electrical photocurrent. This allows a light-absorbing semiconductor chip such as this to also be used to detect light and measure light intensities which are preferably in the visible to infrared wavelength range. Furthermore, a plurality or all of the light-absorbing semiconductor chips in the optoelectronic component may also be formed as silicon diodes. Alternatively or additionally, one or more light-absorbing semiconductor chips may be formed as GaAs diodes, which may be particularly suitable to detect long-wavelength light, for example, red and infrared light. Furthermore, other materials which absorb light and are suitable for use as a protection diode are also feasible.

The semiconductor chips, that is to say the light-emitting semiconductor chips and the light-absorbing semiconductor chips, may be arranged on a carrier. By way of example, the carrier may be formed as a printed circuit board, a metal carrier, for example, in the form of a lead frame, a ceramic carrier, a plastic carrier or a combination thereof. By way of example, the carrier may also be formed as a housing, in particular a plastic housing. By way of example, the housing may have a depression in which the semiconductor chips are arranged. To make electrical contact, the carrier may have a lead frame, conductor tracks and/or connecting pads, by which electrical and/or mechanical contact can be made with the semiconductor chips. In particular, the depression may be designed to be reflective, that is to say it may, for example, have reflective side surfaces and/or a reflective base surface on which the semiconductor chips are mounted such that the light emitted by the light-emitting semiconductor chips may be emitted uniformly from the optoelectronic component.

The semiconductor chips on the carrier may be covered by a cover element and/or at least one optical element. By way of example, the cover element may be arranged in the form of encapsulation or a cover over the semiconductor chips. If the carrier has a housing with a depression in which the semiconductor chips are arranged, then, in particular, the depression may be filled with encapsulation. Furthermore, the semiconductor chips may be followed by an optical element in the form of a lens and/or an optical diffuser such as a scatter plate to allow the emission characteristic of the optoelectronic component to be adapted.

At least one first light-emitting semiconductor chip and one first light-absorbing semiconductor chip connected antiparallel with it, may be arranged on the carrier.

At least one second light-emitting semiconductor chip and one second light-absorbing semiconductor chip connected antiparallel with it, may be arranged on the carrier.

The light-absorbing semiconductor chips may be, as described above, formed as protection diodes, as a result of which the light-emitting semiconductor chips are protected against ESD pulses, as described above, by the antiparallel connection.

The semiconductor chips may be arranged on the carrier such that light from a light-emitting semiconductor chip falls on one of the light-absorbing semiconductor chips not connected to the light-emitting semiconductor chip. By way of example, this may mean that light from the first light-emitting semiconductor chip falls on the second light-absorbing semiconductor chip. Furthermore, this may mean that light from the second light-emitting semiconductor chip falls on the first light-absorbing semiconductor chip. This makes it possible for the light-absorbing semiconductor chips to also be used to detect and/or measure light emitted from the light-emitting semiconductor chips.

Particularly in the case of optoelectronic components which have a plurality of light-emitting semiconductor chips, shifts or changes in the mixed light emitted from the optoelectronic component may occur as a result of different ageing of the light-emitting semiconductor chips, because of different materials and/or a different load. To achieve a light intensity of the emitted mixed light which is as constant as possible throughout the entire lifetime of the optoelectronic component, and a color and light impression which remains as constant as possible, it is advantageous to carry out color and brightness matching at specific times, for example, at specific time intervals in which changes in the light intensity respectively emitted by the light-emitting semiconductor chips can be measured. The operating parameters for the light-emitting semiconductor chips can be adapted on the basis of such measured changes, thus preferably once again making it possible to emit the desired mixed light. This allows regular matching for light and temperature compensation to be carried out during the lifetime of the optoelectronic component. In comparison to known lighting applications in which such matching is carried out by additional external photosensors, in the case of the optoelectronic component described here, this can be done by the parts present in the component, that is to say the light-absorbing semiconductor chips, with the light-absorbing semiconductor chips at the same time formed as protection diodes for the light-emitting semiconductor chips. As a consequence, there is no need for additional photosensors, as in the prior art, and the optoelectronic component described here can be produced with a preferred small physical size, in comparison to known lighting applications. In particular, fewer semiconductor chips are required in comparison to known applications, since the light-absorbing semiconductor chips have a dual functionality.

In a method of operating the optoelectronic component, in a first measurement step the first light-emitting semiconductor chip may be operated with a measurement current wherein light falls on a light-absorbing semiconductor chip of the optoelectronic component, which light-absorbing semiconductor chip is not connected to the first light-emitting semiconductor chip. The light which falls on the absorbing semiconductor chip produces a first photocurrent in the light-absorbing semiconductor chip, which is measured. In a second measurement step, the second light-emitting semiconductor chip may be operated with a measurement current as a result of which light falls on a light-absorbing semiconductor chip, which is not connected to the second light-emitting semiconductor chip. The second photocurrent produced by the incident light is likewise measured in the light-absorbing semiconductor chip. A first operating current for the first light-emitting semiconductor chip is determined from a difference between the first photocurrent and a first nominal value. A second operating current for the second light-emitting semiconductor chip is determined from a difference between the second photocurrent and a corresponding second nominal value, and the first light-emitting semiconductor chip is then operated with the first operating current, and the second light-emitting semiconductor chip is operated with the second operating current.

By way of example, the respective difference between the photocurrent and the nominal value and the respective operating current can be determined by appropriate calculation and/or regulation electronics, for example, also making use of comparison values stored in the calculation and/or regulation electronics. It may also be possible for the measurement current to be increased or decreased continuously or in steps from an initial value until a difference between the respectively measured photocurrent and the associated nominal value is minimized, and is particularly preferably equal to zero. The measurement current when the difference is minimized then corresponds to the required operating current.

The first nominal value and/or the second nominal value may be determined before the optoelectronic component is actually started up. In this case, the nominal value may correspond to the photocurrent in the respectively used light-absorbing semiconductor chips, and is produced by desired operation, or with the desired operational brightness of the light-emitting semiconductor chips. By way of example, the measurement current may therefore correspond to the original operating current of the light-emitting semiconductor chips. As an alternative, it is also possible to use a predetermined measurement current, which may differ from the operating current, for the individual measurements and to determine the nominal values therefrom. When determining the nominal values, it is possible, for example, to also use an external photosensor, by which a desired brightness can be set for the light-emitting semiconductor chips.

Only one light-emitting semiconductor chip is in each case ever illuminated on the individual measurement steps for determining the photocurrents. In this case, the respective photocurrent can be determined in a short time interval, for example, in less than one second and, preferably, in a few tens of milliseconds such that short blinking or illumination of the individual light-emitting semiconductor chips can be perceived by an external viewer, before the optoelectronic component is actually switched on.

The optoelectronic component may have a control apparatus by which the measurement steps and the determination of the operating currents can be carried out. In particular, in a first measurement step, the control apparatus can operate the first light-emitting semiconductor chip with a measurement current and can measure a first photocurrent of one of the light-absorbing semiconductor chips not connected to the first light-emitting semiconductor chip. In a second measurement step, the control apparatus can operate the second light-emitting semiconductor chip with a measurement current and can measure a second photocurrent of one of the light-absorbing semiconductor chips not connected to the second light-emitting semiconductor chip.

The control apparatus may compare the first and second photocurrents with respectively stored nominal values in the manner described above. The control apparatus can determine a first and a second operating current to operate the light-emitting semiconductor chips from a respective difference between the first and the second photocurrents relating to the respective nominal values. Furthermore, the control apparatus can provide the first and second operating currents for permanent operation of the light-emitting semiconductor chips.

The control apparatus may have analogue and/or digital electronic components such as one or more IC chips, by which the photocurrents can be determined and a comparison can be carried out with a nominal value and/or an operating current can be provided.

The control apparatus may be provided in the form of an additional component, for example, a driver circuit, to which a carrier with the semiconductor chips can be connected. As an alternative to an external control apparatus such as this, the control apparatus may also be arranged in or on the carrier, for example, in the form of appropriate population of a carrier in the form of a printed circuit board or housing, on which the semiconductor chips are also arranged.

The optoelectronic component may have at least one third light-emitting semiconductor chip arranged with a third semiconductor chip connected antiparallel to the at least one third light-emitting semiconductor chip and formed as a protection diode, on the carrier. The third light-emitting semiconductor chip may have features such as those described further above in conjunction with the first and second light-emitting semiconductor chips.

In particular, the third light-emitting semiconductor chip may be arranged on the carrier such that, during operation, light falls at least on the first or second light-absorbing semiconductor chip. Therefore, the first or second light-absorbing semiconductor chip can be used in a third measurement step in the method described above to determine a third photocurrent when the measurement current is applied to the third light-emitting semiconductor chip, from which measurement current a third operating current for subsequent continuous operation of the third light-emitting semiconductor chip can be determined by comparison with a nominal value.

The third semiconductor chip, which is formed as a protection diode, may be formed as a light-absorbing semiconductor chip and protection diode. In particular, the third light-emitting semiconductor chip may be connected antiparallel with the third light-absorbing semiconductor chip which can then be used, for example, in the method described above to determine the first and/or second photocurrent.

At least one or more further light-emitting semiconductor chip or chips may be arranged on the carrier. At least one further light-emitting semiconductor chip can be connected on the carrier without a protection diode. In this case, it may be possible for the operating current of the at least one further light-emitting semiconductor chip to be determined by a light-absorbing semiconductor chip according to one of the described method steps, which is connected to another light-emitting semiconductor chip, for example, by the first light-absorbing semiconductor chip.

At least three or more light-emitting semiconductor chips each having a semiconductor chip, the latter of which are each connected in parallel with it and are in the form of protection diodes, may be arranged on the carrier, with at least two of the semiconductor chips in the form of protection diodes being in the form of light-absorbing semiconductor chips.

At least one light-absorbing semiconductor chip in the optoelectronic component may be operated as an environmental-light sensor. For this purpose, the light-absorbing semiconductor chip can convert the environmental light which falls on the optoelectronic component and in particular on the light-absorbing semiconductor chip to a photocurrent which, for example, is measured by a control apparatus.

In a method of operating the optoelectronic component having a carrier on which at least one first light-emitting semiconductor chip and one first light-absorbing semiconductor chip connected antiparallel with it, may be arranged, the first light-absorbing semiconductor chip is in the form of an environmental-light sensor and a protection diode, which produces a photocurrent by environmental light which falls on the optoelectronic component. The first light-emitting semiconductor chip operates when a minimum value for the photocurrent is undershot.

The minimum photocurrent, which corresponds to a minimum environmental brightness, may for this purpose be stored in the control apparatus. If the environmental brightness and therefore also the photocurrent are less than the corresponding minimum values, the control apparatus can operate the at least one or the plurality of light-emitting semiconductor chips on the carrier. For example, in twilight conditions, the optoelectronic component can therefore automatically operate the at least one or the plurality of light-emitting semiconductor chips. In this case, when there are at least two light-emitting semiconductor chips each having light-absorbing semiconductor chips connected antiparallel with them, the measurement steps described above to determine the respective operating current of the light-emitting semiconductor chips can be carried out before the light-emitting semiconductor chips are operated in a continuous mode.

The optoelectronic component may be used as an indicating apparatus, for example, in a vehicle such as a motor car. When the vehicle is started, that is to say, for example, when starting a motor car, the method described above to determine the operating currents can be carried out such that it is possible to ensure that the optoelectronic component is operated with the desired light characteristic, before the actual operation of the optoelectronic component during the use of the vehicle. As an alternative, it is also possible for the method described here to determine the operating currents to be carried out only after the vehicle has been started up a specific number of times.

A multiplicity of optoelectronic components described here may be used in an indicating apparatus such as a display, for example, a full-color video wall. In this case as well, the individual optoelectronic components can be checked for their emitted light and/or for the light emitted by the individual light-emitting semiconductor chips before they are started up on each occasion, or in each case after a specific number of starting-up processes, to determine ageing in the form of brightness drifts. Particularly when using a multiplicity of optoelectronic components described here, this makes it possible to ensure that all the optoelectronic components can be operated as far as possible with the desired light characteristic, thus making it possible to reduce or even entirely prevent optical irregularities, for example, in the form of brightness fluctuations and/or color differences over the indicating area of the display.

Further advantages will become evident from the examples described in the following text in conjunction with the figures.

In the examples and figures, identical components or components having the same effect can each be provided with the same reference symbols. The illustrated elements and the relationships between their sizes could in principle not be considered as being true to scale and, in fact, individual elements, for example, layers, parts, components and areas, may be illustrated in an exaggeratedly thick form or with exaggeratedly large dimensions to assist understanding.

FIG. 1 shows an optoelectronic component according to one example which has a carrier 1, which, in the illustrated examples, is formed as a housing with a depression 10. For this purpose, the carrier 1 has a plastic which forms the housing. Furthermore, the carrier 1 may have electrical contacts in the form of a lead frame, conductor tracks and/or connecting pads (not shown).

A first light-emitting semiconductor chip 11 and a first light-absorbing semiconductor chip 12 connected antiparallel with it, are arranged on the carrier 1, in particular in the depression 10 in the housing in the illustrated example. Furthermore, a second light-emitting semiconductor chip 21 having a second light-absorbing semiconductor chip 22 connected antiparallel with it, are arranged. The light-absorbing semiconductor chips 12, 22 are formed as protection diodes, in particular ESD protection diodes, which protect the respective light-emitting semiconductor chips 11, 21 which are connected to them against voltage spikes, for example, ESD pulses. For this purpose, the light-absorbing semiconductor chips 12, 22 are formed as silicon diodes in the illustrated example, with a forward-biased voltage in the range from 0.6 to 1.2 volts. Alternatively, one or both of the light-absorbing semiconductor chips 12, 22 may also be formed as GaAs diodes or another diode with a suitable light-absorbing material which provides the required protection function.

The light-emitting semiconductor chips 11, 21 may be formed as semiconductor layer sequences, as described in the general part and may, for example, emit light with different colors, as a result of which the optoelectronic component can emit a mixed light depending on the light intensity emitted from the light-emitting semiconductor chips 11, 21. In the illustrated example, the depression 10 is designed to be reflective, as a result of which the light produced during operation by the light-emitting semiconductor chips 11, 21 can be emitted uniformly by the optoelectronic component.

The semiconductor chips 11, 12, 21, 22 are arranged on the carrier 1 such that the light of each light-emitting semiconductor chip 11, 21 falls on at least one of the light-absorbing semiconductor chips 12, 22 not connected to the respective light-emitting semiconductor chip 11, 21. In the example, this means in particular that light from the first light-emitting semiconductor chip 11 falls on the second light-absorbing semiconductor chip 22, while light from the second light-emitting semiconductor chip 21 falls on the first light-absorbing semiconductor chip 12.

Furthermore, further optical components can be arranged over the light-emitting and light-absorbing semiconductor chips 11, 12, 21, 22, for example, encapsulation in the depression 10 and/or an optical component, for example, a lens or an optical diffuser such as a scatter plate or scatter encapsulation.

Figure 2A:
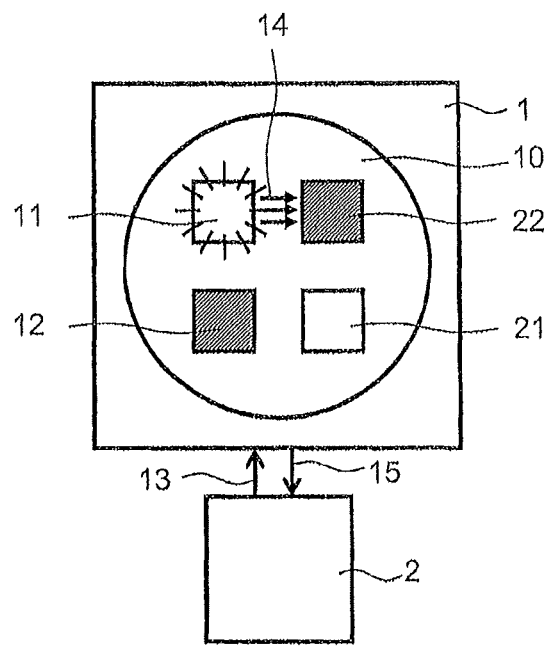
FIGS. 2A to 2C show schematic illustrations of a method of operating an optoelectronic component according to a further example.

A method of operating the optoelectronic component as shown in FIG. 1 will be described in connection with FIGS. 2A to 2C. For this purpose, the optoelectronic component furthermore has a control apparatus 2 designed to provide measurement currents and operating currents, and to measure photocurrents, as described in the following text. In the illustrated example, the control apparatus 2 is formed as an external control apparatus, to which the carrier 1 with the semiconductor chips 11, 12, 21, 22 can be connected. The electrical connection is indicated by the arrows 13, 15, 23, 25, 16 and 26. Alternatively, the control apparatus 2 may also be integrated in the carrier 1.

Before actual operation of the optoelectronic component, the first light-emitting semiconductor chip 11 is operated in a first measurement step. For this purpose, the control apparatus 2 provides a measurement current 13, by which the first light-emitting semiconductor chip 11 is operated. Light 14, which is emitted from the first light-emitting semiconductor chip 11 and corresponds to a portion of the total light emitted by the first light-emitting semiconductor chip 11, falls on the second light-absorbing semiconductor chip 22. The second light-emitting semiconductor chip 21 is in this case not in operation, as a result of which a first photocurrent 15 can be measured via the connections by which the second light-emitting semiconductor chip can actually be operated, with this first photocurrent 15 being produced by the light 14 in the second light-absorbing semiconductor chip 22. The first photocurrent 15 is compared to a nominal value stored in the control apparatus 2, by which it is possible to detect ageing defects such as a reduction in the light intensity of the first light-emitting semiconductor chip 11, in the measurement current 13. The control apparatus 2 can use the difference between the first photocurrent 15 and the corresponding nominal value to determine a first operating current 16, in the manner described above in the general part.

Figure 2B:
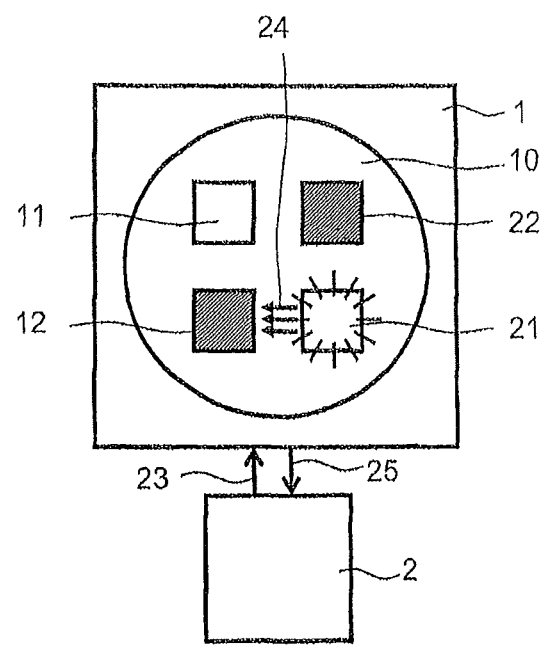

In a further, second measurement step as shown in FIG. 2B, the second light-emitting semiconductor chip 21 operates with a measurement current 23 with the first light-emitting semiconductor chip 11 switched off. A portion of the light emitted by the second light-emitting semiconductor chip 21 and identified by the reference symbol 24 in FIG. 2B, therefore falls on the first light-absorbing semiconductor chip 12, which produces a second photocurrent 25. The second photocurrent 25 is measured by the control apparatus 2. A second operating current 26 can be determined by comparing the second photocurrent 25 with a corresponding nominal value, stored in the control apparatus 2.

Figure 2C:
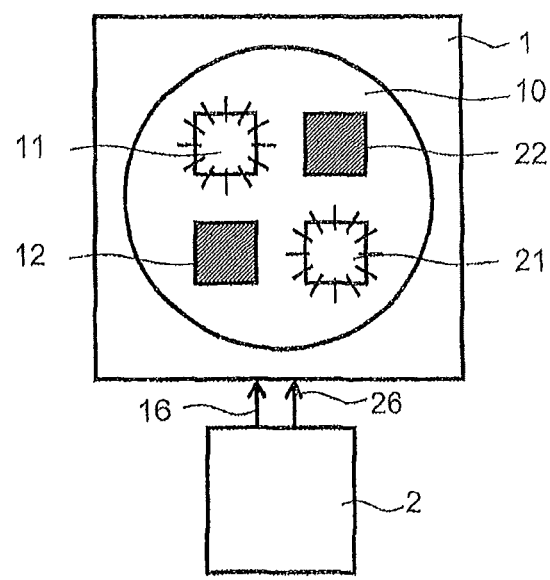

The operating currents 16 and 26 which have been determined in this way are then provided for continuous operation of the optoelectronic component as shown in FIG. 2C, by the control apparatus 2 to operate the light-emitting semiconductor chips 11, 21. During continuous operation, the light-absorbing semiconductor chips 12, 22 in this case act as protection diodes to protect the light-emitting semiconductor chips 11, 21.

Figure 3:
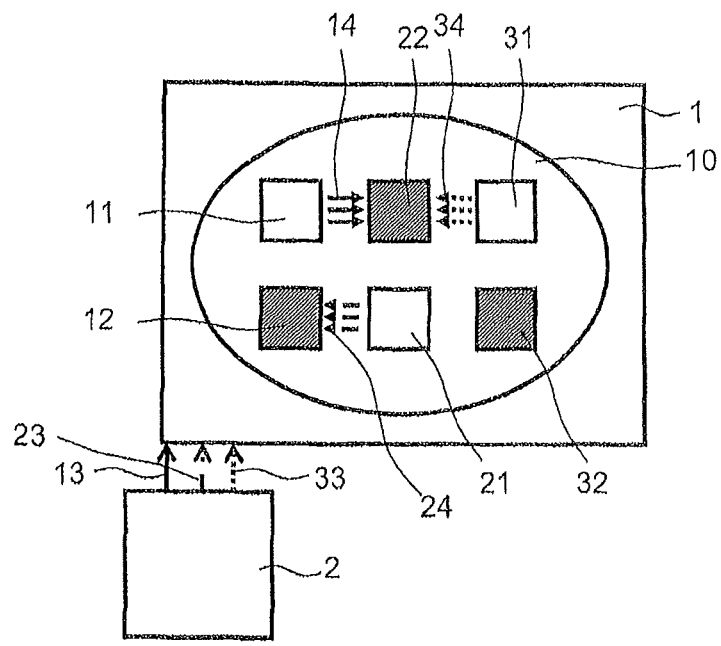
FIGS. 3 and 4 show schematic illustrations of optoelectronic components according to further examples.

FIG. 3 shows a further example of an optoelectronic component which, in addition to the first and second light-emitting and light-absorbing semiconductor chips 11, 12, 21, 22 according to the previous example, has a third light-emitting semiconductor chip 31 connected to a third semiconductor chip 32, which is connected antiparallel to the third light-emitting semiconductor chip 31 and is in the form of a protection diode. The measurement steps as described in conjunction with the previous example and in the following text, and which are carried out successively, are shown jointly, for the sake of clarity, in FIG. 3.

To determine operating currents for the first and second light-emitting semiconductor chips 11, 21, measurement currents 13, 23 are applied successively to the light-emitting semiconductor chips 11, 21, as described in conjunction with the previous example, thus making it possible for the control apparatus 2 (not shown) to respectively measure a first and a second photocurrent.

Once a third operating current for the third light-emitting semiconductor chip 31 has been determined, a measurement current 33 is applied to the third light-emitting semiconductor chip 31, while the first and second light-emitting semiconductor chips 11, 21 are not operated, and with light 34 emitted by the third light-emitting semiconductor chip 31 falling on the second light-absorbing semiconductor chip 22, which thus produces a third photocurrent (not shown). The third photocurrent is compared by the control apparatus 2 with an appropriate nominal value, thus making it possible to determine a third operating current for the third light-emitting semiconductor chip 31, in the manner described above. The third semiconductor chip 32, which is in the form of a protection diode, need not necessarily be in the form of a light-absorbing semiconductor chip in this case. Therefore, only two light-absorbing semiconductor chips are required in the example.

Furthermore, additional light-emitting semiconductor chips may also be provided, whose respective operating current can be determined in a corresponding manner to that described for the light-emitting semiconductor chips 11, 21, 31. In this case, by way of example, it may also be sufficient for only the first and second light-absorbing semiconductor chips 12, 22 to absorb light, while further semiconductor chips, provided as protection diodes for the further light-emitting semiconductor chips, do not need to absorb light.

Figure 4:
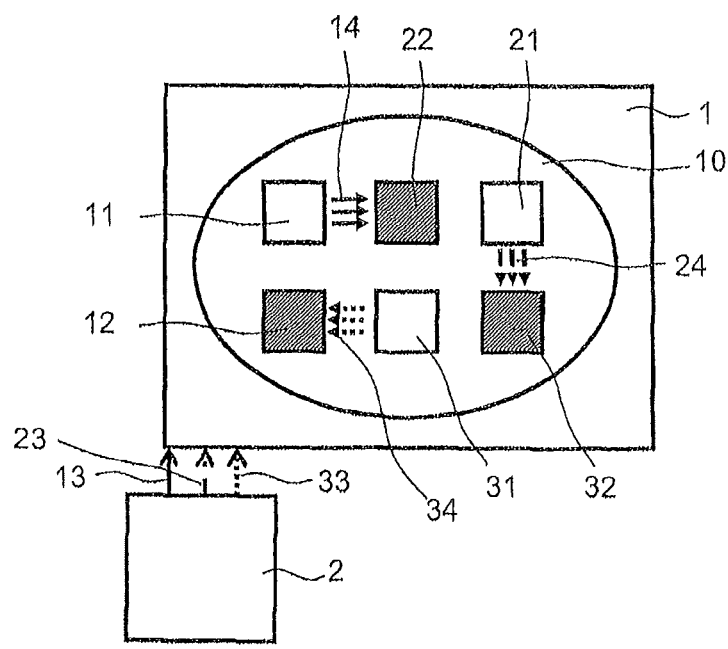

FIG. 4 shows a further example of an optoelectronic component having a first, a second and a third light-emitting semiconductor chip 11, 21, 31, with the third light-emitting semiconductor chip 31 being connected antiparallel with a third light-absorbing semiconductor chip 32, which is in the form of a protection diode. As previously in FIG. 3, the measurement steps carried out successively are indicated jointly in FIG. 4.

As already described in conjunction with the previous examples, in the first measurement step, the first photocurrent can be produced by the second light-absorbing semiconductor chip 22 during operation of the first light-emitting semiconductor chip 11. In a subsequent measurement step during operation of the second light-emitting semiconductor chip 21, the second photocurrent can be produced by the third light-absorbing semiconductor chip 32, while the third photocurrent can be produced in a further, subsequent measurement step by operation of the first light-absorbing semiconductor chip during operation of the third light-emitting semiconductor chip 31. Since one and only one light-absorbing semiconductor chip 12, 22, 32 is associated with each light-emitting semiconductor chip 11, 21, 31, and is used to determine the respective photocurrent for the measurement current, the light-absorbing semiconductor chips 12, 22, 32 may, for example, be controlled for the emission spectrum of the respectively associated light-absorbing semiconductor chip 11, 21, 31. Furthermore, it is sufficient for the light from the light-emitting semiconductor chips 11, 21, 31 to respectively fall on the light-absorbing chip 12, 22, 32 which is used for measurement of the photocurrent, thus making it possible to provide a high level of design freedom for the arrangement of the semiconductor chips 11, 12, 21, 22, 31, 32 on the carrier 1.

In addition to the semiconductor chips 11, 12, 21, 22, 31, 32 provided in the illustrated example, further light-emitting semiconductor chips and light-absorbing semiconductor chips may also be arranged on the carrier, and can be operated in the same way as the semiconductor chips 11, 12, 21, 22, 31, 32.

Figure 5:
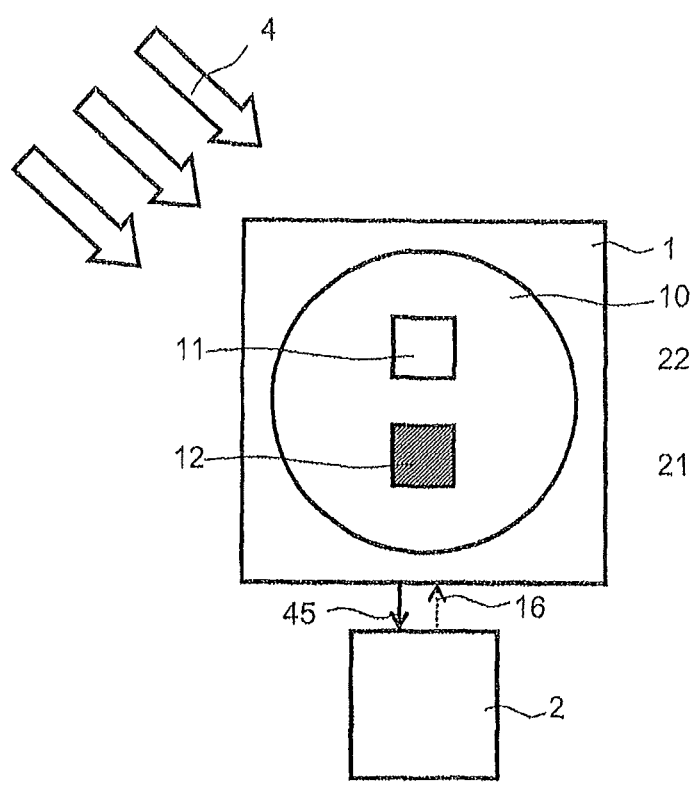
FIG. 5 shows a schematic illustration of an optoelectronic component according to a still further example.

FIG. 5 shows a further example of an optoelectronic component having a first light-emitting semiconductor chip 11 and a first light-absorbing semiconductor chip 12 connected antiparallel with it, on a carrier 1 which, for example, is formed as a housing with a depression 10, as in the previous examples. The first light-absorbing semiconductor chip 12 is formed as a protection diode, in the same way as in the previous examples.

Furthermore, the first light-absorbing semiconductor chip 12 is operated as an environmental-light sensor when the first light-emitting semiconductor chip 11 is not being operated. This means that a photocurrent 45 monitored by the control apparatus 2, is produced, as a function of the environmental light 4 which falls on the optoelectronic component and in particular on the first light-absorbing semiconductor chip 12, and in particular as a function of its brightness, by the first light-absorbing semiconductor chip 12. If the brightness of the environmental light 4 falls below a specific minimum value, and therefore the photocurrent 45 from the first light-absorbing semiconductor chip 12 also falls below a minimum photocurrent stored in the control apparatus 2, the first light-emitting semiconductor chip 11 is operated by the control apparatus 2 by providing an operating current 16 for the first light-emitting semiconductor chip 11, as is indicated in FIG. 5.

Furthermore, the optoelectronic component illustrated in FIG. 5 may also have further light-emitting and light-absorbing semiconductor chips, as described in the previous examples.

Furthermore, one light-absorbing semiconductor chip 12, 22, 32 of one of the optoelectronic components described in conjunction with FIGS. 1 to 4 may also be in the form of, and may be operated as, an environmental-light sensor in the manner described in conjunction with FIG. 5. The light-absorbing semiconductor chip formed as an environmental-light sensor can monitor the brightness of the area surrounding the optoelectronic semiconductor component, and can operate it when a minimum environmental brightness is undershot. Furthermore, before continuous operation of the optoelectronic component, the measurement steps described in conjunction with FIGS. 2A to 4 may be carried out to determine the operating currents of the light-emitting semiconductor chips.

The optoelectronic components in the illustrated examples are particularly suitable for displays such as full-color video walls in which one optoelectronic component may in each case be used to represent one pixel. Furthermore, the optoelectronic components are also particularly preferably suitable for illumination of an indicating apparatus, for example, in motor vehicles, which require a constant brightness and emitted color characteristic. The methods described here to determine the respective operating currents can therefore be carried out whenever a full-color video wall such as this or a motor vehicle is switched on, or else in each case always after a specific number of switching-on processes to allow a light characteristic which is as constant as possible throughout the entire lifetime of the optoelectronic components.

The description on the basis of the examples does not restrict this disclosure to these examples. In fact, the disclosure covers every novel feature and every combination of features, in particular including every combination of features in the appended claims, even if the feature or combination is not itself explicitly mentioned in the claims or examples.

The invention claimed is:

1. An optoelectronic component comprising:
a carrier on which at least one first light-emitting semiconductor chip and one first light-absorbing semiconductor chip connected antiparallel to the at least one first light-emitting semiconductor chip, at least one second light-emitting semiconductor chip and one second light-absorbing semiconductor chip connected antiparallel to the at least one second light-emitting semiconductor chip,
wherein the semiconductor chips are arranged on the carrier such that light from each light-emitting semiconductor chip falls on at least one of the light-absorbing semiconductor chips not connected to the respective light-emitting semiconductor chip, and
the light-absorbing semiconductor chips are formed as protection diodes.

2. The optoelectronic component according to claim 1, wherein at least one of the light-absorbing semiconductor chips is a silicon diode or a GaAs diode.

3. The optoelectronic component according to claim 1, which has a control apparatus designed
to operate, in a first measurement step, the first light-emitting semiconductor chip with a measurement current and measure a first photocurrent of one of the light-absorbing semiconductor chips not connected to the first light-emitting semiconductor chip, and
to operate, in a second measurement step, the second light-emitting semiconductor chip with a measurement current and measure a second photocurrent in one of the light-absorbing semiconductor chips not connected to the second light-emitting semiconductor chip.

4. The optoelectronic component according to claim 3, wherein the control apparatus compares the first and second photocurrents with stored nominal values, and uses a respective difference between the first and second photocurrents the stored nominal value to determine a nominal value of a first and a second operating current to operate the light-emitting semiconductor chips.

5. The optoelectronic component according to claim 1, wherein the carrier has a housing with a depression in which the semiconductor chips are arranged.

6. The optoelectronic component according to claim 5, wherein the depression is designed to be reflective.

7. The optoelectronic component according to claim 1, wherein at least one third light-emitting semiconductor chip with a third semiconductor chip connected antiparallel to the at least one third light-emitting semiconductor chip and formed as a protection diode, is arranged on the carrier.

8. The optoelectronic component according to claim 7, wherein, during operation, light from the third light-emitting semiconductor chip falls at least on the first or second light-absorbing semiconductor chip.

9. The optoelectronic component according to claim 7, wherein the third semiconductor chip formed as a protection diode is light-absorbing.

10. The optoelectronic component according to claim 1, wherein at least one of the light-emitting semiconductor chips has a wavelength conversion element which converts at least a portion of primary light, which is emitted by the light-emitting semiconductor chip, to secondary light which is different therefrom.

11. The optoelectronic component according to claim 1, wherein the light-emitting semiconductor chips emit different light from one another.

12. A method of operating an optoelectronic component comprising:
a carrier on which at least one first light-emitting semiconductor chip and one first light-absorbing semiconductor chip connected antiparallel to the at least one first light-emitting semiconductor chip, at least one second light-emitting semiconductor chip and one second light-absorbing semiconductor chip, which is connected antiparallel to the at least one second light-emitting semiconductor chip, wherein the semiconductor chips are arranged on the carrier such that light from each light-emitting semiconductor chip falls on at least one of the light-absorbing semiconductor chips not connected to the respective light-emitting semiconductor chip, and the light-absorbing semiconductor chips are formed as protection diodes, the method comprising:

in a first measurement step, the first light-emitting semiconductor chip is operated with a measurement current and a first photocurrent of a light-absorbing semiconductor chip is measured, on which light from the first light-emitting semiconductor chip falls and which is not connected to the first light-emitting semiconductor chip, in a second measurement step, the second light-emitting semiconductor chip is operated with a measurement current and a second photocurrent of a light-absorbing semiconductor chip is measured, on which light from the second light-emitting semiconductor chip falls and which is not connected to the second light-emitting semiconductor chip, a first operating current is determined from a difference between the first photocurrent and a first nominal value, a second operating current is determined from a difference between the second photocurrent and a second nominal value, and the first light-emitting semiconductor chip is then operated with the first operating current, and the second light-emitting semiconductor chip is operated with the second operating current.

13. The method according to claim 12, wherein in the first measurement step the first photocurrent is produced by the second light-absorbing semiconductor chip, in the second measurement step the second photocurrent is produced by the first light-absorbing semiconductor chip, in the optoelectronic component a third light-emitting semiconductor chip is provided, with a third semiconductor chip connected antiparallel to the third light-emitting semiconductor chip and formed as a protection diode, in a third measurement step the third light-emitting semiconductor chip is operated with a measurement current to produce light which falls on the second light-absorbing semiconductor chip which produces a third photocurrent, and in addition to the first and second operating currents, a third operating current for operating the third light-emitting semiconductor chip is determined from a difference between the third photocurrent and a third nominal value.

14. The method according to claim 12, wherein in the first measurement step, the first photocurrent is produced by the second light-absorbing semiconductor chip, in the optoelectronic component a third light-emitting semiconductor chip is provided with a third light-absorbing semiconductor chip connected antiparallel to the third light-absorbing semiconductor chip and formed as a protection diode, in the second measurement step, the second photocurrent is produced by the third light-absorbing semiconductor chip, in a third measurement step, the third light-emitting semiconductor chip is operated with a measurement current to produce light which falls on the first light-absorbing semiconductor chip, which produces a third photocurrent, and in addition to the first and second operating currents, a third operating current to operate the third light-emitting semiconductor chip is determined from a difference between the third photocurrent and a third nominal value.

15. A method of operating an optoelectronic component having a carrier on which at least one first light-emitting semiconductor chip and one first light-absorbing semiconductor chip connected antiparallel to the at least one first light-emitting semiconductor chip, are arranged, in which the first light-absorbing semiconductor chip is formed as an environmental-light sensor and as a protection diode, which produces a photocurrent by environmental light which falls on the optoelectronic component, and in which the at least one first light-emitting semiconductor chip is operated when a minimum value for the photocurrent is undershot.

* * * * *

UNITED STATES PATENT AND TRADEMARK OFFICE
CERTIFICATE OF CORRECTION

PATENT NO. : 9,293,629 B2
APPLICATION NO. : 14/007098
DATED : March 22, 2016
INVENTOR(S) : Wicke et al.

Page 1 of 1

It is certified that error appears in the above-identified patent and that said Letters Patent is hereby corrected as shown below:

In the claims

Column 12, line 3, after "chip," insert --are arranged,--.

Column 13, line 3, after "chip," insert --are arranged,--.

Signed and Sealed this
Fifth Day of July, 2016

Michelle K. Lee
*Director of the United States Patent and Trademark Office*